(12) United States Patent
Xia et al.

(10) Patent No.: US 11,342,390 B2
(45) Date of Patent: May 24, 2022

(54) DISPLAY PANEL, DISPLAY DEVICE AND A METHOD FOR MANUFACTURING A DISPLAY PANEL

(71) Applicant: Shanghai Tianma Micro-Electronics Co., Ltd., Shanghai (CN)

(72) Inventors: Xingda Xia, Shanghai (CN); Tianyi Wu, Shanghai (CN); Liang Xing, Shanghai (CN); Yinghua Mo, Shanghai (CN); Shaorong Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 101 days.

(21) Appl. No.: 16/728,730

(22) Filed: Dec. 27, 2019

(65) Prior Publication Data

US 2020/0312925 A1    Oct. 1, 2020

(30) Foreign Application Priority Data

Mar. 29, 2019 (CN) .......................... 201910247802.5

(51) Int. Cl.
  *H01L 27/32* (2006.01)
  *H01L 51/52* (2006.01)
  *H01L 51/56* (2006.01)

(52) U.S. Cl.
  CPC ...... *H01L 27/3232* (2013.01); *H01L 27/3234* (2013.01); *H01L 27/3246* (2013.01); *H01L 27/3258* (2013.01); *H01L 27/3269* (2013.01); *H01L 27/3272* (2013.01); *H01L 51/5284* (2013.01); *H01L 51/56* (2013.01); *H01L 2227/323* (2013.01)

(58) Field of Classification Search
  CPC .............. H01L 25/167; H01L 25/0753; H01L 27/3225; H01L 33/62; H01L 33/58
  See application file for complete search history.

(56) References Cited

U.S. PATENT DOCUMENTS

2019/0080664 A1* 3/2019 Li .................... G09G 3/3433

FOREIGN PATENT DOCUMENTS

| CN | 106684108 A | 5/2017 |
|---|---|---|
| CN | 108986678 A | 12/2018 |

OTHER PUBLICATIONS

Chinese Office Action for Chinese Priority Application No. 201910247802.5; Office Action dated Jul. 31, 2020.

\* cited by examiner

*Primary Examiner* — Julio J Maldonado
*Assistant Examiner* — Stanetta D Isaac
(74) *Attorney, Agent, or Firm* — von Briesen & Roper, s.c.

(57) ABSTRACT

Provided are a display panel, a display device and a method for manufacturing a display panel. The display panel includes a display area including a first display area and a second display area. The second display area is multiplexed as a sensor reserved area. The second display area includes a light transmitting area and a light emitting area. The first display area is provided with a plurality of organic light emitting units. The light emitting area of the second display area is provided with a plurality of Micro LEDs. The second display area is further provided with a wall structures disposed in gaps between the plurality of Micro LEDs and the plurality of organic light emitting units and gaps between adjacent ones of the plurality of Micro LEDs.

16 Claims, 11 Drawing Sheets

DISPLAY PANEL, DISPLAY DEVICE AND A METHOD FOR MANUFACTURING A DISPLAY PANEL

CROSS-REFERENCES TO RELATED APPLICATIONS

This application claims priority to Chinese patent application No. CN201910247802.5 filed on Mar. 29, 2019, the disclosure of which is incorporated herein by reference in its entirety.

TECHNICAL FIELD

The present disclosure relates to display techniques and, in particular, to a display panel, a display device and a method for manufacture a display panel.

BACKGROUND

With the development of display technology, more and more display panels and display devices are used in people's daily life and work. To improve the user experience, sensor modules, such as cameras, infrared sensors and the like, are typically integrated in existing display panel structures.

At present, to satisfy a high screen-to-body ratio, a hollowed-out area is usually disposed in an intermediate area at one end of the display panel, and a sensor module is disposed in the hollowed-out area. On this basis, displaying still cannot be performed in the hollowed-out area, that is, a real full screen display cannot be achieved.

SUMMARY

A display panel, a display device and a method for manufacturing a display panel are provided in embodiments of the present disclosure.

In a first aspect, embodiments of the present disclosure provide a display panel. The display panel includes: a display area including a first display area and a second display area. The second display area is multiplexed as a sensor reserved area, and the second display area includes a light transmitting area and a light emitting area.

The first display area is provided with a plurality of organic light emitting units.

The light emitting area of the second display area is provided with a plurality of Micro LEDs.

The second display area is further provided with wall structures disposed in gaps between the plurality of Micro LEDs and the plurality of organic light emitting units and gaps between adjacent Micro LEDs of the plurality of Micro LEDs.

In a second aspect, embodiments of the present disclosure further provide a display device. The display device includes the display panel provided in the first aspect, and further includes a sensor module disposed in the second display area.

In a third aspect, embodiments of the present disclosure further provide a method for manufacturing a display panel including: forming wall structures in the second display area of the display panel; forming a plurality of organic light emitting units in the first display area of the display panel; and forming a plurality of Micro LEDs in the second display area of the display panel.

The second display area is multiplexed as a sensor reserved area and includes a light emitting area and a light transmitting area. The plurality of Micro LEDs are disposed in the light emitting area. The wall structures are configured in gaps between the plurality of Micro LEDs and the plurality of organic light emitting units and gaps between adjacent ones of the plurality of Micro LEDs.

The display panel provided by embodiments of the present disclosure includes a display area. The display area includes a first display area and a second display area. The second display area is multiplexed as a sensor reserved area, and the second display area includes a light transmitting area and a light emitting area. The first display area is provided with a plurality of organic light emitting units. The light emitting area of the second display area is provided with a plurality of Micro LEDs; and the second display area is further provided with wall structures configured in gaps between the plurality of Micro LEDs and the plurality of organic light emitting units and gaps between adjacent ones of the plurality of Micro LEDs.

DETAILED DESCRIPTION

Figure 1:
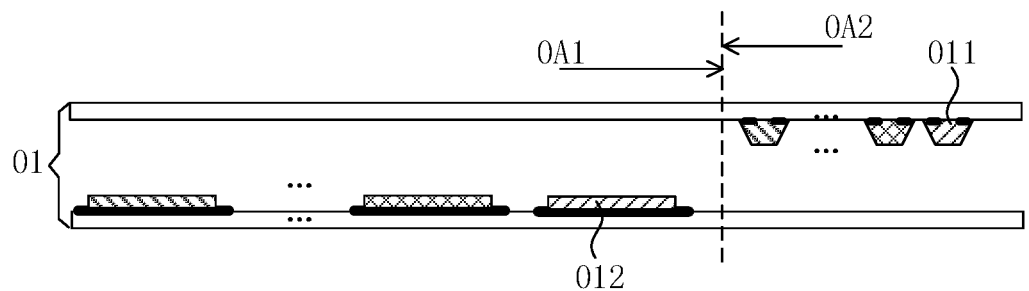
FIG. 1 is a structural diagram of a display panel in the related art.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, merely part, not all, of the structures related to the present disclosure are illustrated in the drawings.

FIG. 1 is a structural diagram of a display panel in the related art. Referring to FIG. 1, the display panel 01 includes: a first display area 0A1 and a second display area 0A2. The second display area 0A2 is configured to be transparent display so that a photosensitive module such as a camera can be placed. In the first display area 0A1, the plurality of organic light emitting units 011 emit light so that an image is displayed, and in the second display area 0A2, the plurality of Micro Light Emitting Diodes (Micro LEDs) 012 emit light so that an image is displayed, helping achieve the full screen design of the display panel 01.

However, in the structure of the display panel 01, since part of the light emitted from the plurality of Micro LEDs 012 is transmitted transversely (that is, in any direction within the plane of the display panel 01), lateral light is formed. When the lateral light is transmitted to the positions of the Micro LEDs 012 adjacent to the above Micro LEDs 012 or the plurality of organic light emitting units 011, the light emitting effect of the plurality of Micro LEDs 012 or the plurality of organic light emitting units 011 at this position is affected, that is, optical crosstalk exists. The optical crosstalk of the lateral light of the plurality of Micro LEDs 012 to the peripheral display units (including the plurality of Micro LEDs 012 and the plurality of organic light emitting units 011) causes the display effect of the display panel 01 to be poor.

In view of the above problems, embodiments of the present disclosure provide a display panel. The display panel is provided with wall structures configured in gaps between the plurality of Micro LEDs and the plurality of organic light emitting units and gaps between adjacent Micro LEDs of the plurality of Micro LEDs. The wall structures are used to block the transmission of Micro LED's lateral light to the peripheral display units, thereby weakening the optical crosstalk of the lateral light of the plurality of Micro LEDs to the peripheral display units and improving the display effect of the display panel. The following explains the display panel, the display device, and the method for manufacturing the display panel according to embodiments of the present disclosure with reference to FIGS. 2 to 19.

Figure 2:
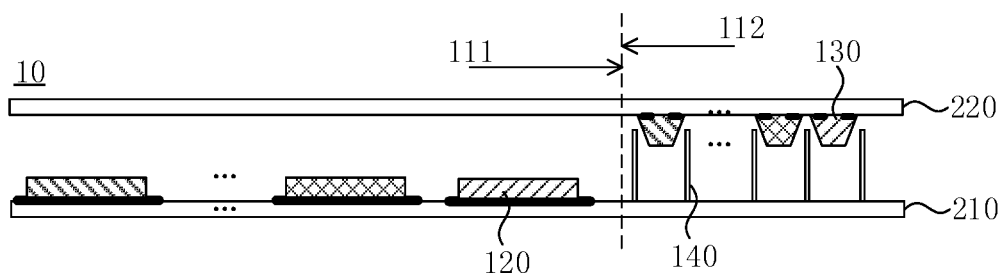
FIG. 2 is a structural diagram of a display panel according to embodiments of the present disclosure.
Figure 3:
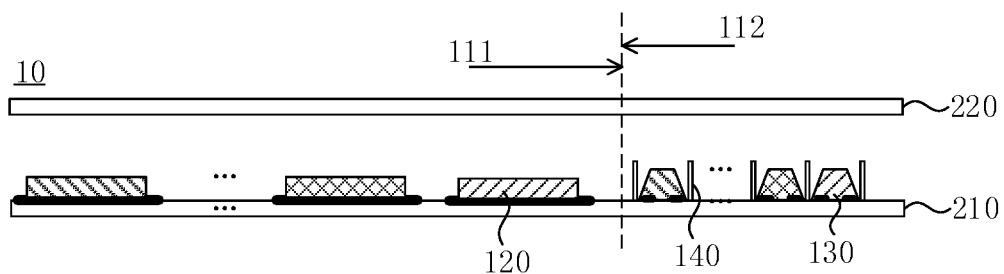
FIG. 3 is a structural diagram of another display panel according to embodiments of the present disclosure.

Exemplarily, FIG. 2 is a structural diagram of a display panel according to embodiments of the present disclosure, and FIG. 3 is a structural diagram of another display panel according to embodiments of the present disclosure. Referring to FIGS. 2 and 3, the display panel 10 includes a display area including a first display area 111 and a second display area 112. The second display area 112 is multiplexed as a sensor reserved area 112. The second display area 112 includes a light transmitting area and a light emitting area. The first display area 111 is provided with a plurality of organic light emitting units 120 and a light emitting area of the second display area 112 is provided with a plurality of Micro LEDs 130. The second display area 112 is further provided with wall structures 140 configured in gaps between the plurality of Micro LEDs and the plurality of organic light emitting units and gaps between adjacent Micro LEDs of the plurality of Micro LEDs.

The first display area 111 includes a display area structure of a conventional organic light emitting panel in the related art. Exemplarily, the first display area 111 may include a plurality of scan lines and a plurality of data lines that are insulated from each other and cross each other. The scan lines and the data lines define a plurality of sub-pixel areas. In each sub-pixel area, one organic light emitting unit 120 is formed. The scan lines and the data lines may be perpendicular to each other. The first display area 111 may also include other structures knowable to those skilled in the art. These structures will not be described and limited in embodiments of the present disclosure.

The second display area 112 is a sensor reserved area 112, that is, a back surface of the display panel 10 corresponding to the second display area 112 needs to be provided with a sensor in a subsequent process. The plurality of Micro LEDs 130 are disposed in a light emitting area of the second display area 112. The size of the plurality of Micro LEDs 130 is of micron dimension, and is smaller than the size of the plurality of organic light emitting units 120. In the display panel 10 provided by embodiments of the present disclosure, by use of the characteristic that the plurality of Micro LEDs 130 are small in size, a relatively large light transmitting area having high light transmittance can be reserved while the second display area 112 is ensured to display an image, and thus, the sensor disposed on the back surface of the display panel 10 can work normally.

The second display area 112 is further provided with wall structures 140 used for preventing light emitted by the plurality of Micro LEDs 130 from being transversely transmitted to the peripheral display units or weakening this light. The wall structures 140 are disposed in gaps between the plurality of Micro LEDs 130 and the plurality of organic light emitting units 120 so that light emitted from the plurality of Micro LEDs 130 and transmitted to the position of the plurality of organic light emitting units 120 adjacent to the plurality of Micro LEDs 130 can be weakened (or blocked). Meanwhile, the wall structures 140 are configured in gaps between adjacent Micro LEDs of the plurality of Micro LEDs 130 so that light emitted from the plurality of Micro LEDs 130 and transmitted to the positions of the Micro LEDs 130 adjacent to the above Micro LEDs 130 can be weakened (or blocked). In this way, the optical crosstalk of the lateral light of the plurality of Micro LEDs 130 to the peripheral display units can be weakened or prevented, thereby helping improve the display effect of the display panel 10.

It should be noted that FIGS. 2 and 3 merely exemplarily show that the display panel 10 includes a display area, and the number of the first display area 111 and the number of the second display area 112 included in the display area are both 1, but this arrangement does not constitute a limitation on the display panel 10 provided by embodiments of the present disclosure. In other implementations, the display panel 10 may further include a frame area surrounding the display area and other areas knowable to those skilled in the art, and the number and arrangement of the first display area 111 and the second display area 112 may also be configured according to actual requirements of the display panel 10 and are not limited in embodiments of the present disclosure.

Exemplarily, in the first display area 111, to drive the plurality of organic light emitting units 120 to emit light, generally a plurality of thin film transistors are included in a pixel driving circuit corresponding to each organic light emitting unit 120. For example, the pixel driving circuit including the compensation circuit portion may be a 7T1C circuit, that is, a circuit including 7 thin film transistors and 1 storage capacitor. Since the thin film transistors are usually light-tight structures, the reserved light transmitting area is small with the design of the 7T1C circuit. Therefore, a sensor such as a camera cannot be disposed in the area corresponding to the first display area 111.

Exemplarily, the plurality of Micro LEDs 130 may adopt an active driving method. The second display area 112 further includes a driving circuit for driving the plurality of Micro LEDs 130 to emit light. The driving circuit for driving the plurality of Micro LEDs 131 to emit light may be a 3T1C circuit, that is, a circuit including 3 thin film transistors and 1 storage capacitor. A larger light transmitting area may be reserved in the second display area 112 because the number of thin film transistors is small and the plurality of Micro LEDs 130 are small in size, thereby forming a smaller light shielding area. In this way, in the display panel 10, when the first display area 111 and the second display area 112 perform display, self-luminescence can be achieved in a current-driven manner. Therefore, the display difference between the first display area 111 and the second display area 112 is small, helping improve the display effect of the display panel 10.

Exemplarily, the plurality of Micro LEDs 130 may also be passively driven; the anode of each Micro LED 130 is connected to a first signal line, the cathode of each Micro LED 130 is connected to a second signal line. The first signal line and the second signal line are used for providing a light emitting voltage signal to the plurality of Micro LEDs 130. In this way, a separate driving circuit is not required, only the first signal line and the second signal line are needed to provide the light emitting voltage signal, helping simplify the circuit in the second display area 112, and making the whole light transmittance of second display area 112 higher. Therefore, disposing the sensor at the back surface of second display area 112 is beneficial to guaranteeing that the detection accuracy of sensor is higher.

Exemplarily, to improve the light utilization rate of the sensor and make the sensor receive more ambient light, the plurality of Micro LEDs 130 in embodiments of the present disclosure may also be transparent Micro LEDs, that is, each layer structure of the plurality of Micro LEDs 130 is formed from a transparent material. The specific film structure and material of the plurality of Micro LEDs 130 are not limited in embodiments of the present disclosure.

Optionally, the plurality of organic light emitting units 120 and the plurality of Micro LEDs 130 may be disposed on the same substrate, or may be disposed on opposite sides of two substrates disposed opposite to each other. Meanwhile, the wall structures 140 and the plurality of Micro LEDs 130 may be disposed on the same substrate, or may be disposed on opposite sides of two substrates disposed opposite to each other. In this way, the full screen design is achieved, the display effect of the display panel 10 is improved, and the actual flexibility of the display panel 10 is improved.

Exemplarily, referring to FIG. 2, the display panel 10 includes a first substrate 210 and a second substrate 220 disposed opposite to each other. In the first display area 111, the plurality of organic light emitting units 120 are disposed on a surface of the first substrate 210 facing to the second substrate 220. In the light emitting area of the second display area 112, a plurality of Micro LEDs 130 are disposed on the surface of the second substrate 220 facing to the first substrate 210. In the second display area 112, the wall structures 140 are disposed on a surface of the first substrate 210 facing to the second substrate 220.

Exemplarily, the first substrate 111 is an array substrate, and the second substrate 112 is a protective cover. The wall structures 140 are disposed on a side of the array substrate facing to the protective cover, so that the wall structures 140 can be formed by using a portion of a film structure in the array substrate (described in detail below), which is beneficial for simplifying a process for manufacturing the display panel.

Exemplarily, referring to FIG. 3, the same portions of FIG. 3 as FIG. 2 are not described again, except that in the light emitting area of the second display area 112 in FIG. 3, a plurality of Micro LEDs 130 are disposed on the surface of the first substrate 210 facing to the second substrate 220.

At this time, the plurality of organic light emitting units 120, the plurality of Micro LEDs 130 and the wall structures 140 are all disposed on the surface of the first substrate 210 facing to the second substrate 220, which is beneficial to reducing the alignment difficulty of the plurality of Micro LEDs 130 and the wall structures 140 in the manufacturing process, reducing the distance between the first substrate 210 and the second substrate 220, and reducing the overall thickness of the display panel 10.

It should be noted that FIGS. 2 and 3 merely schematically illustrate the arrangement of the plurality of organic light emitting units 120, the plurality of Micro LEDs 130, and the wall structures 140 on the surface of the first substrate 210 or on the surface of the second substrate 220 in the display panel 10, but do not limit the display panel 10 provided by embodiments of the present disclosure. In other embodiments, the wall structures 140 and the plurality of Micro LEDs 130 may be disposed, according to the actual requirement of the display panel 10, in the second display area 112 and on the surface, facing the first substrate 110, of the second substrate 220 or other arrangements knowable to those skilled in the art are adopted, which is not limited in embodiments of the present disclosure.

In addition, it should be noted that, when the plurality of Micro LEDs 130 adopts an active driving method, a driving circuit of the plurality of Micro LEDs 130 may be disposed on the same substrate as the plurality of Micro LEDs 130, or may be disposed on a different substrate from the plurality of Micro LEDs 130, which may be configured according to actual requirements of the display panel 10, which is not limited in embodiments of the present disclosure.

Hereinafter, the structure of the display panel 10 is exemplified only by using an example in which the organic light emitting unit 120 and the wall structures 140 are both disposed on the surface, facing the second substrate 220 of the first substrate 210 and the plurality of Micro LEDs 130 are disposed on the surface, facing the first substrate 210 of the second substrate 220. Meanwhile, when the film structure on the first substrate 210 is not involved, the first substrate 210 and the film thereon may be considered as a whole.

Figure 4:
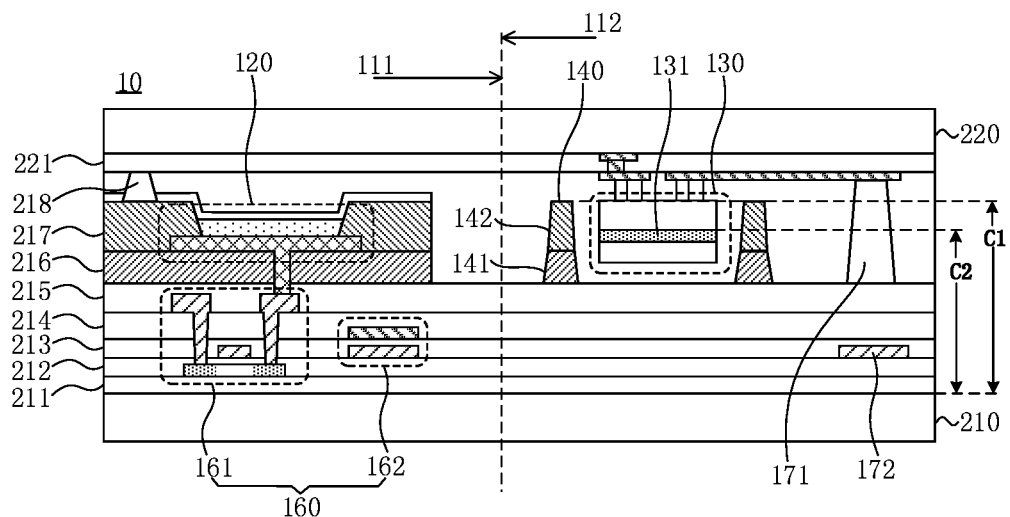
FIG. 4 is a structural diagram of another display panel according to embodiments of the present disclosure.

Optionally, FIG. 4 is a structural diagram of another display panel according to embodiments of the present disclosure. Referring to FIG. 4, a distance C1 from one side surface of the wall structures 140, facing away from the first substrate 210 to the first substrate 210 is greater than or equal to a distance C2 from one side surface of a light emitting layer 131 of the plurality of Micro LEDs 130 facing away from the first substrate 210 to the first substrate 210.

The arrangement may also be understood as that the height of the wall structures 140 is equal to or greater than the height of the light emitting layer 131 of the plurality of Micro LEDs 130 with respect to the plane of the first substrate 210. In this way, the lateral light emitted from the light emitting layer 131 is blocked by the wall structures 140 as much as possible and cannot be further transmitted to the peripheral display units, so that the optical crosstalk of the plurality of Micro LEDs 130 to the peripheral display units can be weakened, thereby helping improve the display effect of the display panel 10.

It should be noted that, in embodiments of the present disclosure, the absolute sizes of C1 and C2 are not limited, and both of them only need to satisfy the qualitative relationship of C1≥C2.

Figure 5:
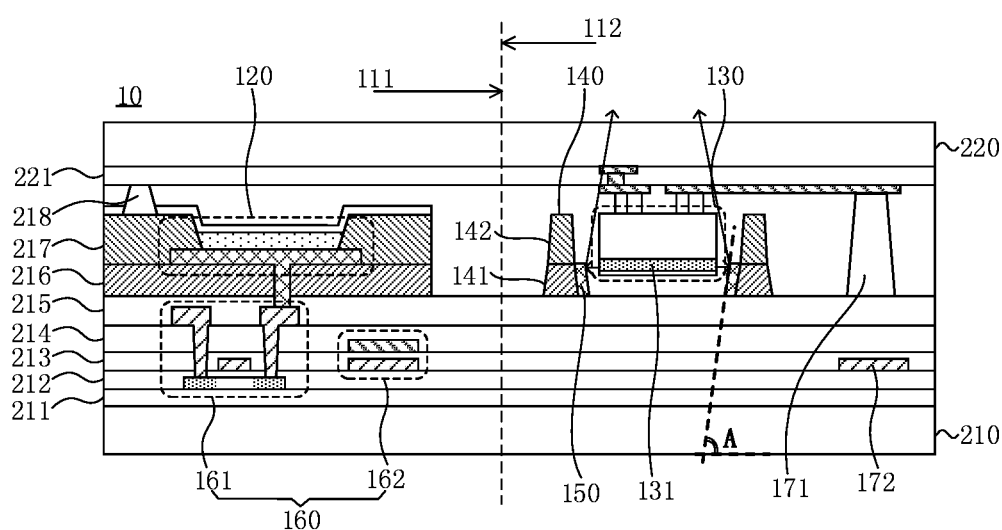
FIG. 5 is a structural diagram of another display panel according to embodiments of the present disclosure.

Optionally, FIG. 5 is a structural diagram of another display panel according to embodiments of the present disclosure. Referring to FIG. 5, the display panel 10 further includes a reflective layer 150 covering at least a sidewall surface, facing the plurality of Micro LEDs 130, of the wall structures 140.

The reflective layer 150 is used for reflecting the light emitted from the light emitting layer 131 of the plurality of Micro LEDs 130, so that the reflected light is emitted from the light emitting surface of the display panel 10, thereby reducing the optical crosstalk of the plurality of Micro LEDs 130 to the peripheral display units and improving the light utilization rate of the plurality of Micro LEDs 130.

Exemplarily, when the height of the wall structures 140 is equal to the height of the light emitting layer 131 of the plurality of Micro LEDs 130, the sidewall surface of the wall structures 140 facing to the plurality of Micro LEDs 130 is entirely covered by the reflective layer 150; when the height of the wall structures 140 is greater than the height of the light emitting layer 131 of the plurality of Micro LEDs 130, the reflective layer 150 may merely cover from one side of the wall structures 140 to a position flush with the height of the light emitting layer 131 of the plurality of Micro LEDs 130 on the sidewall surface of the wall structures 140 facing to the plurality of Micro LEDs 130, so as to ensure that the lateral light emitted from the light emitting layer 131 can be reflected and emitted from the light emitting surface of the display panel 10.

Using the orientation in FIG. 5 as an example, FIG. 5 merely schematically illustrates the reflection of the light emitted from the light emitting layer 131 by the reflective layers 150 disposed on the left and right sides of the plurality of Micro LEDs 130. In the practical structure of the display panel 10, to avoid the influence of the lateral light of the plurality of Micro LEDs 130 on the peripheral display unit as much as possible, for each of the plurality of Micro LEDs 130, vertical projections of the wall structures 140 on the first substrate 210 may be disposed to surround the vertical projection of the each of the plurality of Micro LEDs 130 on the first substrate 140. Thus, the reflective layer 150 is disposed on the sidewall surface of the wall structures 140 facing to the plurality of Micro LEDs 130 and around the plurality of Micro LEDs 130, so that the lateral light in all directions emitted from the light emitting layer 131 may be reflected by the reflective layer 150.

Optionally, referring to FIG. 5, the angle between the reflective layer 150 covering the sidewall surface of the wall structures 140 and the first substrate 210 is A, and 30°≤A≤70°.

With this arrangement, on the one hand, the lateral light emitted from the light emitting layer 131 of the plurality of Micro LEDs 130 can be effectively reflected and emitted from the light emitting surface of the display panel 10, thereby improving the light utilization rate of the display panel 10; on the other hand, the process difficulty of forming the angle A is small, being beneficial to reducing the manufacturing difficulty of the display panel 10.

It should be noted that 30°≤A≤70° is only an exemplary description of the angle A, and is not a limitation. In other embodiments, 45°≤A≤65°, 40°≤A≤50°, or other angles may be configured according to the actual requirement of the display panel 10, which is not limited in the embodiments of the present disclosure. It should also be noted that, if the thickness of the reflective layer 150 is uniform relative to the sidewall surface of the wall structure 140, the angle between the sidewall surface, facing the plurality of Micro LEDs 130, of the wall structure and the first substrate 210 is equal to A, that is, the above angle relationship is also satisfied.

In addition, it should be noted that a vertical projection of one side of the reflective layer 150 facing away from the first substrate 210 on the first substrate 210 surrounds a vertical projection of a side of the reflective layer 150 facing to the first substrate 210 on the first substrate 210. It can be further understood that, if on the reflective layer 150, if the side of the reflective layer 150 facing to the first substrate 210 is defined as a bottom and the side the reflective layer 150 facing away from the first substrate 210 is defined as a top, then the reflective layer 150 has an opening when extending from the base to the top.

Figure 6:
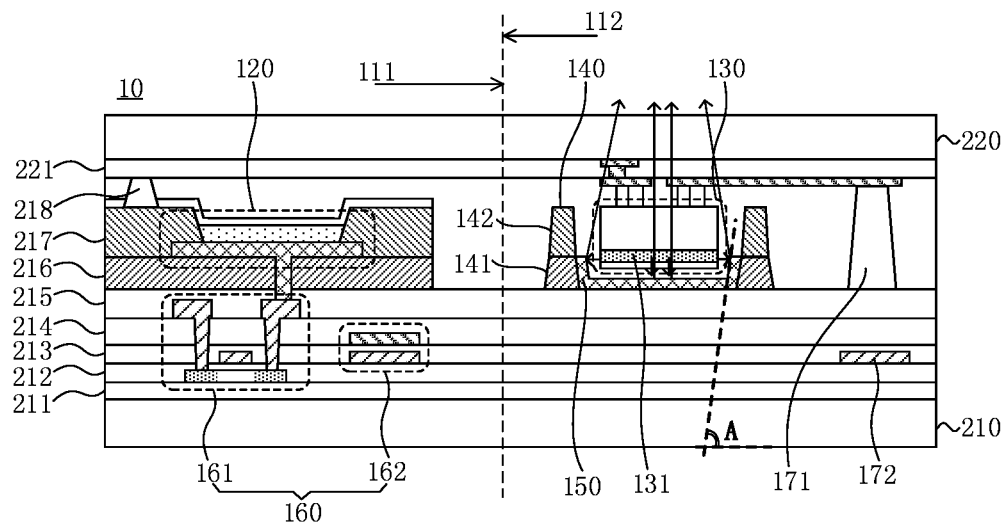
FIG. 6 is a structural diagram of another display panel according to embodiments of the present disclosure.

Optionally, FIG. 6 is a structural diagram of another display panel according to embodiments of the present disclosure. Referring to FIG. 6, the reflective layer 150 is also disposed on a surface of the first substrate 210 between the connected Micro LEDs 130.

The reflective layer 150 on a surface of the first substrate 210 is used for reflecting the light emitted from the light emitting layer 131 of the plurality of Micro LEDs 130 opposite to the reflective layer 150 and transmitted toward the first substrate 210, so that the light is emitted from the light emitting surface of the display panel 10, thereby improving the light utilization rate of the plurality of Micro LEDs 130.

Exemplarily, the principle is illustrated in FIG. 6 with merely two light rays perpendicular to the first substrate 210.

The above-mentioned arrangement of the reflective layer 150 in the present embodiment can also be understood as that, for each of the plurality of Micro LEDs 130, the reflective layer 150 is not only disposed on the inner sidewall surface, surrounding the plurality of Micro LEDs 130, of the wall structures 140, but also disposed on the surface, facing the plurality of Micro LEDs 130 and surrounded by the wall structures 140, of the first substrate 210.

In addition, in FIG. 5, the reflective layer 150 is not disposed on the surface of the first substrate 210, so that the reflectivity at the position can be weakened, which is beneficial to avoiding the influence of the ambient light on the display effect, thereby helping improve the display effect of the display panel 10.

Figure 7:
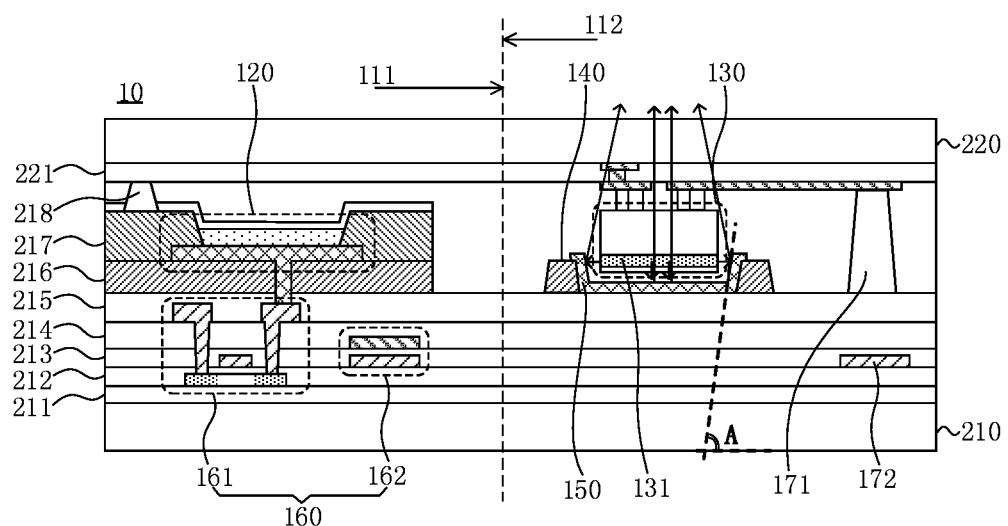
FIG. 7 is a structural diagram of another display panel according to embodiments of the present disclosure.

Optionally, FIG. 7 is a structural diagram of another display panel according to embodiments of the present disclosure. Referring to any one of FIGS. 4 to 7, in the first display area 111, the display panel further includes a pixel driving circuit 160, a planarization layer 216 and a pixel defining layer 217 sequentially stacked on a surface of the first substrate 210 facing to the second substrate 220; the pixel defining layer 216 includes a plurality of pixel openings, and each of the plurality of organic light emitting units 120 is disposed in one of the pixel openings. The wall structures 140 and the planarization layer 216 and/or the pixel defining layer 217 are formed by using the same material in the same process step.

The pixel driving circuit 160 is used to drive the plurality of organic light emitting units 120 to emit light. Exemplarily, the pixel driving circuit 160 may include a thin film transistor (T) 161 and a storage capacitor (C) 162, the pixel driving circuit 160 may be a 2T1C circuit, a 7T1C circuit, or other types of pixel driving circuits knowable to those skilled in the art, which is not limited in embodiments of the present disclosure.

Exemplarily, the display panel 01 further includes a buffer layer 211, a gate insulation layer 212, an intermediate dielectric layer 213, an intermediate insulation layer 214, and a passivation layer 215, which are sequentially stacked on a side of the first substrate 210 facing to the second substrate 220, and then a planarization layer 216 and a pixel defining layer 217 are stacked behind the passivation layer 215. Each of the plurality of organic light emitting units 120 is disposed in the pixel opening of the pixel defining layer 217, and each of the plurality of organic light emitting units 120 may include a first electrode, a second electrode, and a light emitting layer disposed between the first electrode and the second electrode. Exemplarily, the first electrode is a metal electrode layer and the second electrode is an oxide transparent electrode layer. One side of each of the plurality of organic light emitting units 120 facing away from the first substrate 210 is further provided with a supporting pillar 218.

Exemplarily, the display panel 10 further includes a first conductive layer, an insulation layer 221 and a second conductive layer disposed and stacked on a side, facing the first substrate 210, of the second substrate 220. Exemplarily, when the plurality of Micro LEDs 130 are passively driven, a first signal line may be formed in the first conductive layer, and a second signal line may be formed in the second conductive layer.

Exemplarily, the display panel 10 may be formed by the first substrate 210 and the second substrate 220 that are bonded by way of encapsulation by a glass frit, that is, by way of welding by a sealant 171. In the packaging method, the metal reflective layer 172 may be disposed in the packaging area of the first substrate 210, so as to improve the curing rate of the sealant 171 and further improve the packaging effect.

In embodiments of the present disclosure, the wall structures 140 and the planarization layer 216 and/or the pixel defining layer 217 are formed by using the same material in the same process step, so that no additional process step is required, which is beneficial to reducing the manufacturing cost of the display panel 10. Meanwhile, the additional film structure is not added, that is, the number of the films of the display panel 10 is not added, which is beneficial to the light and thin design of the display panel 10.

It should be noted that the materials of the planarization layer 216 and the pixel defining layer 217 may be any materials knowable to those skilled in the art, and the forming process thereof may be any process knowable to those skilled in the art, which is not described in detail and not limited in embodiments of the present disclosure.

Optionally, referring to any one of FIGS. 4 to 6, the wall structures 140 includes a first sub-wall layer 141 and a second sub-wall layer 142 stacked on a side of the first substrate 210 facing to the second substrate 220. The first sub-wall layer 141 and the planarization layer 216 are disposed in the same layer, and the second sub-wall layer 142 and the pixel defining layer 217 are disposed in the same layer; the light absorption coefficient of the material of the pixel defining layer 217 is B, and B ≥ 80%.

With this arrangement, on the one hand, it is beneficial to making the wall structures 140 with a sufficient height to weaken or block the optical crosstalk of the lateral light emitted from the light emitting layer 131 of the plurality of Micro LEDs 130 to the peripheral display units; on the other hand, by setting the light absorption coefficient B of the material of the pixel defining layer 217 to be greater than or equal to 80%, that is, the light absorption coefficient of the second sub-wall layer 142 to be greater than or equal to 80%, the light that is transversely transmitted to the second sub-wall layer 142 can be absorbed by the second sub-wall layer 142, thereby facilitating the weakening of the optical crosstalk.

It should be noted that the wall structures 140 are not disposed in a whole layer, but is schematized and disposed only around the plurality of Micro LEDs 130. Therefore, although the second sub-wall layer 142 in the wall structures 140 may absorb some of the ambient light, the photosensitive accuracy of the sensor module is not affected.

Optionally, the reflective layer 150 and the metal electrode layer in each of the plurality of organic light emitting units 120 are formed by using the same material in the same process step.

With this arrangement, the manufacturing cost of the display panel 10 can be reduced without increasing the number of process steps and introducing new materials; meanwhile, the number of films of the display panel 10 is not increased, which is beneficial to the light and thin design of the display panel 10.

Exemplarily, the material of the metal electrode layer may be gold, silver, an alloy, or any one or several metal materials knowable to those skilled in the art, which is not limited in embodiments of the present disclosure.

Exemplarily, the forming process of the metal electrode layer may be sputtering, evaporation, or any process method knowable to those skilled in the art, which is not limited by embodiments of the present disclosure.

Exemplarily, the material of the pixel defining layer 217 is a black organic material.

Therefore, the lateral light emitted by the light emitting layer 131 of the plurality of Micro LEDs 130 can be effectively absorbed, so that the optical crosstalk of the plurality of Micro LEDs 130 to the peripheral display units can be effectively avoided, and the display effect of the display panel 10 can be improved.

It should be noted that the black organic material may be any one or several materials knowable to those skilled in the art, and embodiments of the present disclosure are not described in detail and are not limited thereto.

Optionally, in the first display area 111, the buffer layer 211, the gate insulation layer 212, the interlayer dielectric layer 213, the intermediate insulation layer 214, and the passivation layer 215 stacked on the surface, facing the second substrate 220, of the first substrate 210 extend to the second display area 112. The second display area 112 is provided with a via hole structure 219. The depth of the via hole structure is less than or equal to the total thickness of the buffer layer 211, the gate insulation layer 212, the interlayer dielectric layer 213, the intermediate insulation layer 214 and the passivation layer 215. The wall structures 140 is disposed within the via hole structure 219.

In this way, the stability of the wall structures 140 can be increased, so that the long-term stability of the display panel 10 can be improved, and the service life of the display panel 10 can be prolonged.

A depth of the wall structure 140 extending from the surface of the passivation layer 215 toward the first substrate 210 may be a depth of an integral number of films, or may be a depth of part of the films, which is not limited in embodiments of the present disclosure. Such wall structure has the same effect as the above wall structure.

Figure 8:
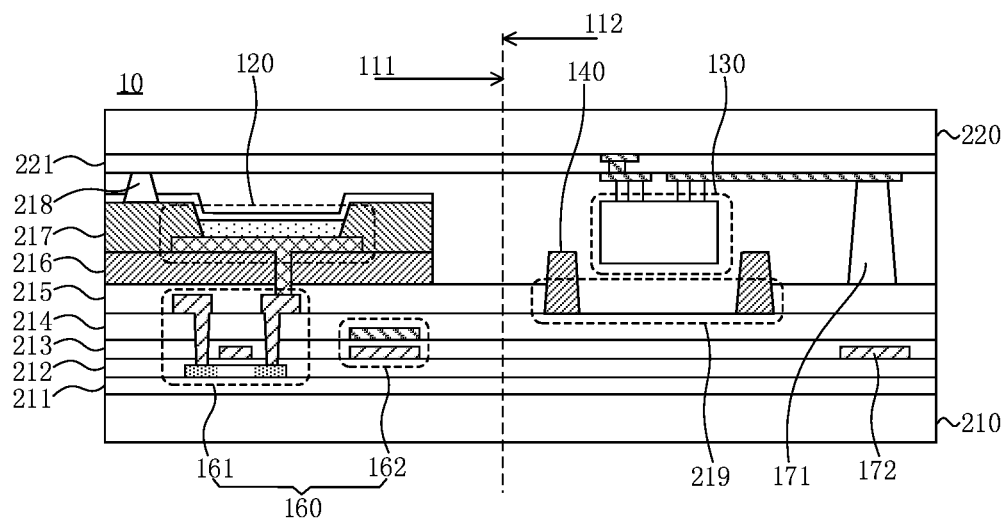
FIG. 8 is a structural diagram of another display panel according to embodiments of the present disclosure.

Exemplarily, FIG. 8 is a structural diagram of another display panel according to embodiments of the present disclosure. Referring to FIG. 8, the depth of the via hole structure 219 is the thickness of the passivation layer 215. The wall structures 140 is disposed on one side surface of the intermediate insulation layer 214 facing away from the first substrate 210.

Figure 9:
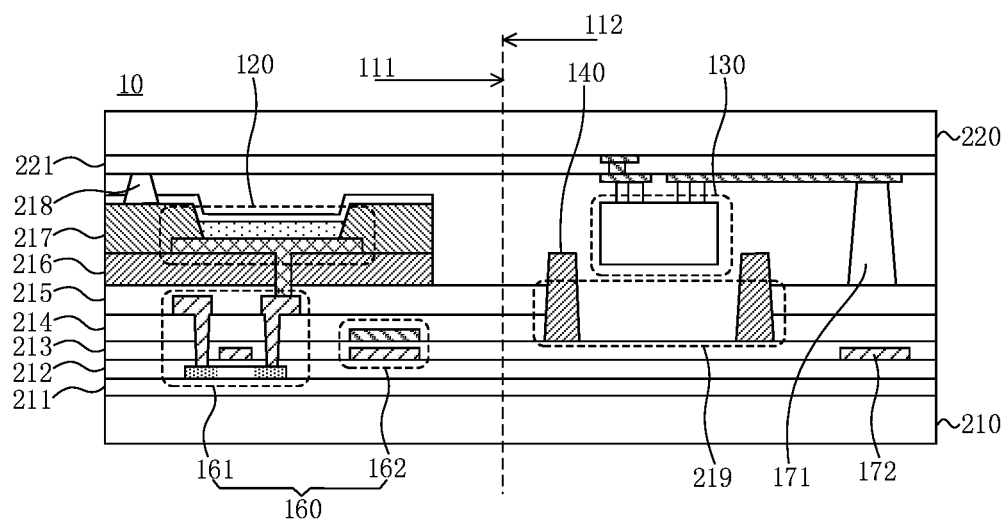
FIG. 9 is a structural diagram of another display panel according to embodiments of the present disclosure.

Exemplarily, FIG. 9 is a structural diagram of another display panel according to embodiments of the present disclosure. Referring to FIG. 9, the depth of the via hole structure 219 is the total thickness of the passivation layer 215 and the intermediate insulation layer 214. The wall structures 140 is disposed on one side surface of the interlayer dielectric layer 214 facing away from the first substrate 210.

Figure 10:
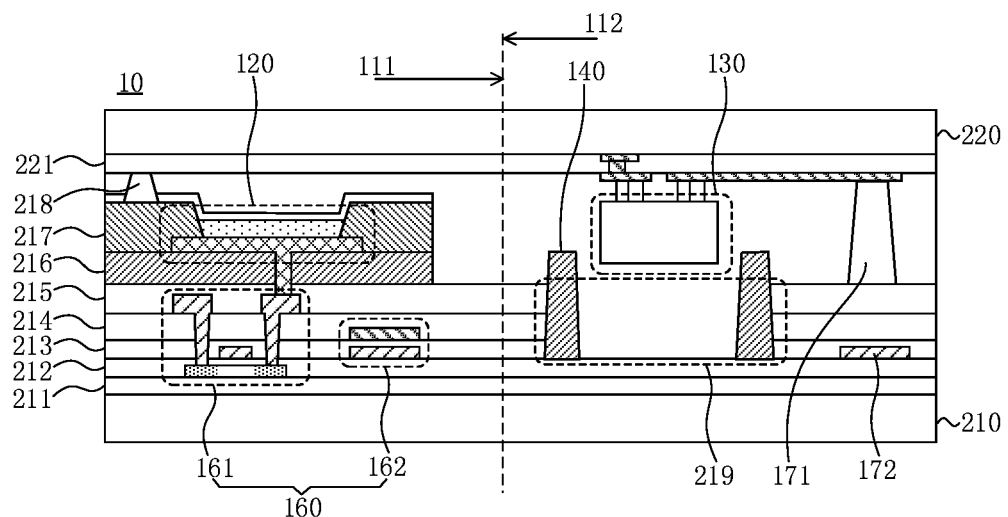
FIG. 10 is a structural diagram of another display panel according to embodiments of the present disclosure.

Exemplarily, FIG. 10 is a structural diagram of another display panel according to embodiments of the present disclosure. Referring to FIG. 10, the depth of the via hole structure 219 is the total thickness of the passivation layer 215, the intermediate insulation layer 214 and the interlayer dielectric layer 213. The wall structure 140 is disposed on one side surface, backing onto the first substrate 210, of the gate insulation layer 212.

Figure 11:
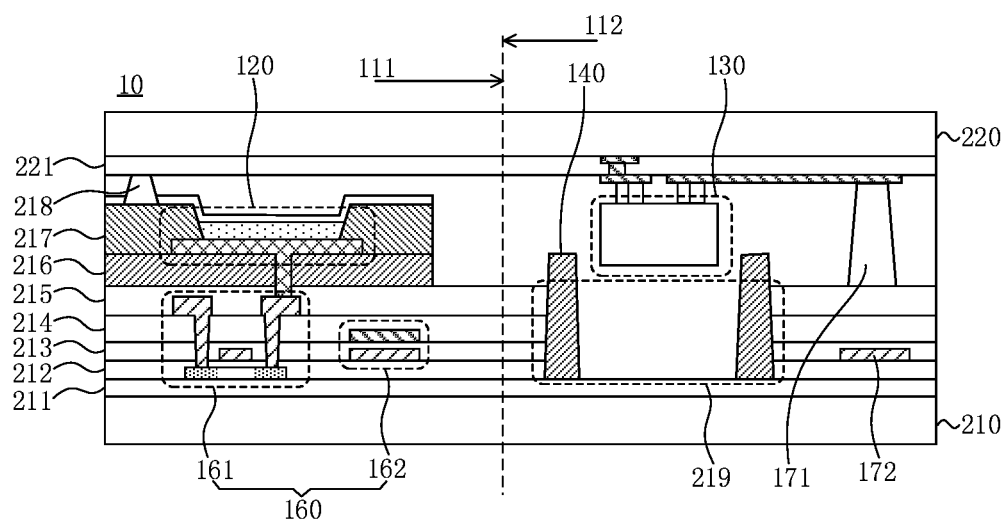
FIG. 11 is a structural diagram of another display panel according to embodiments of the present disclosure.

Exemplarily, FIG. 11 is a structural diagram of another display panel according to embodiments of the present disclosure. Referring to FIG. 11, the depth of the via hole structure 219 is the total thickness of the passivation layer 215, the intermediate insulation layer 214 and the interlayer dielectric layer 213 and the gate insulation layer 212. The wall structures 140 is disposed on one side surface, backing onto the first substrate 210, of the buffer layer 211.

Figure 12:
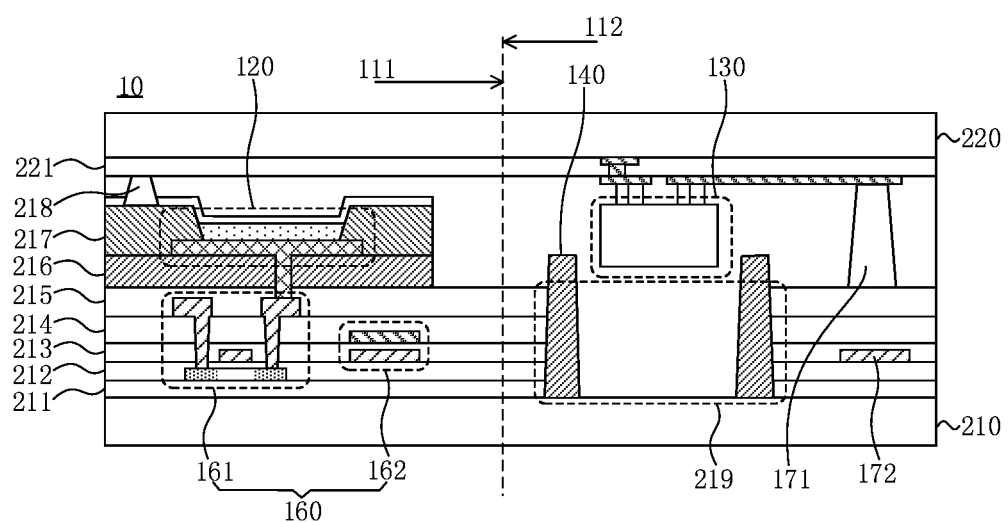
FIG. 12 is a structural diagram of another display panel according to embodiments of the present disclosure.

Exemplarily, FIG. 12 is a structural diagram of another display panel according to embodiments of the present disclosure. Referring to FIG. 12, the depth of the via hole structure 219 is the total thickness of the passivation layer 215, the intermediate insulation layer 214 and the interlayer dielectric layer 213, the gate insulation layer 212 and the buffer layer 211. The wall structures 140 is disposed on one side surface, facing the second substrate 210, of the first layer 211.

It should be noted that in the structures of the display panel 10 shown in FIGS. 4 to 7, the cutout structure is not provided. The wall structures 140 is directly disposed on the surface of the film, closest to the second substrate 220, of the first substrate 210.

In addition, it should be noted that the structures of the display panel 10 provided in the above embodiments may be combined with each other without conflict. Exemplarily, in the structures of the display panel 10 shown in FIGS. 8 to 12, a reflective layer may be further disposed, and the reflective layer may cover a surface of the sidewall, facing the plurality of Micro LEDs 130, of the wall structures 140, and may also cover a surface, facing the plurality of Micro LEDs 130, of the first substrate 210, which will not be described in detail and limited in embodiments of the present disclosure.

In the above, the relative positional relationship between the structures of the display panel 10 is exemplified with reference to FIGS. 2 to 12. The dimensions of the vertical projections of the plurality of Micro LEDs 130, the wall structures 140, and the reflective layer 150 in the display panel 10 on the plane parallel to the display panel 10 are exemplified with reference to FIGS. 13 to 15.

Figure 13:
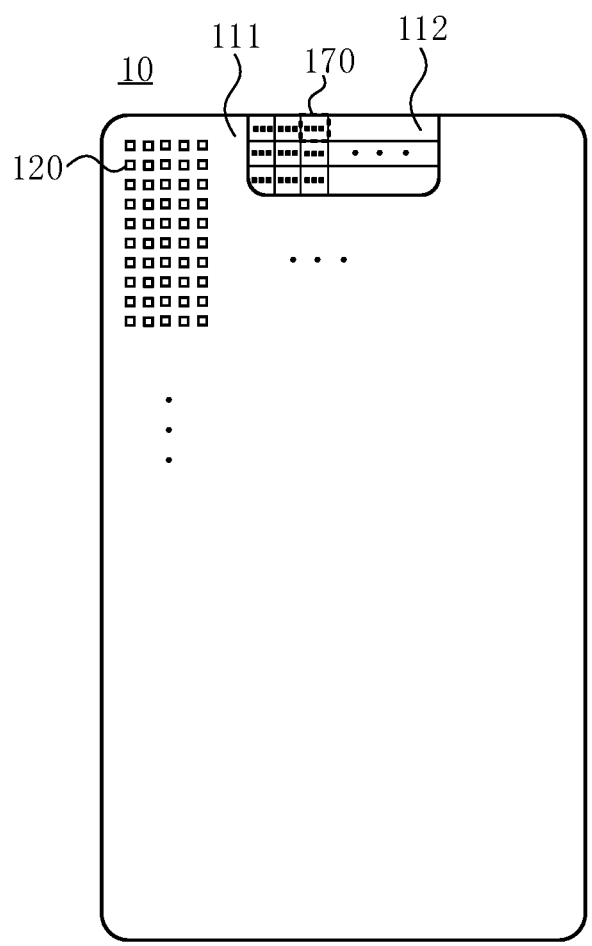
FIG. 13 is a top view of another display panel according to embodiments of the present disclosure.

Exemplarily, FIG. 13 is a structural diagram of another display panel according to embodiments of the present disclosure. Referring to FIG. 13, the display area of the display panel includes a first display area 111 including a plurality of organic light emitting units 120 and a second display area 112 divided into a plurality of pixel areas 170. The area of one pixel area 170 is equivalent to the area of an organic light emitting pixel area corresponding to each of the plurality of organic light emitting units 120 in the first display area 111, where "equivalent" is understood as "to be equal within an error allowable range". In this way, it is beneficial to making the pixel density of the first display area 111 and the pixel density of the second display area 112 to be equal, which is beneficial to improving the display effect of the display panel 10.

Figure 14:
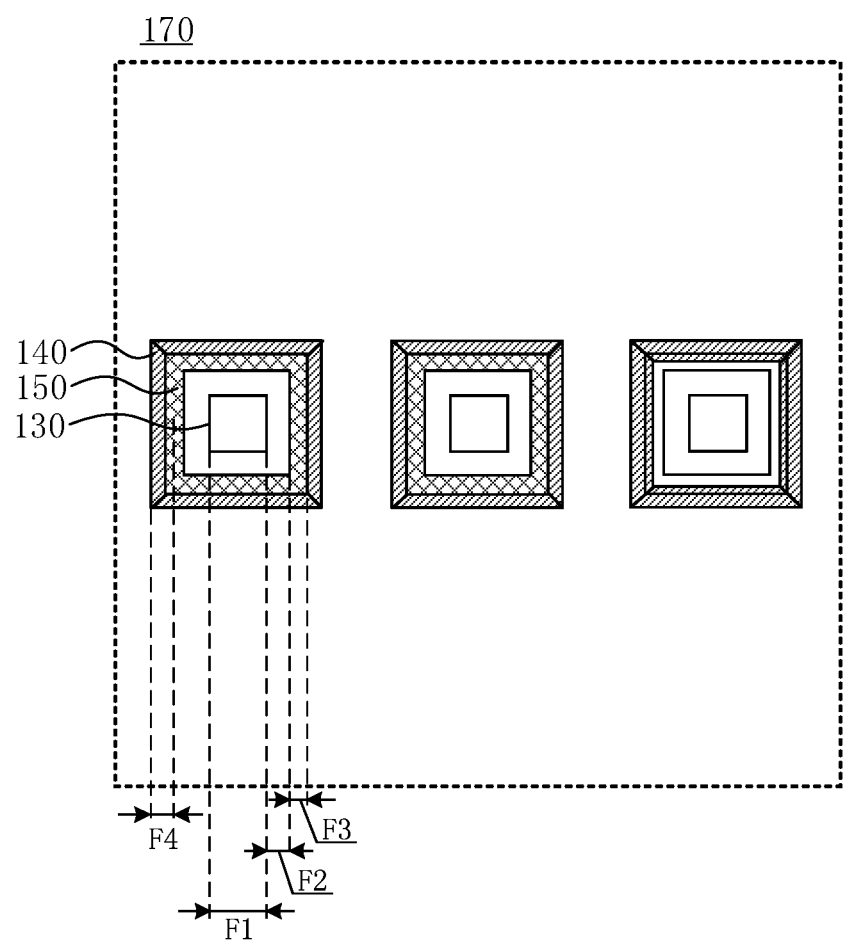
FIG. 14 is an enlarged view of a structure of the pixel area 170 of FIG. 13.

Exemplarily, FIG. 14 is an enlarged view of a structure of the pixel area 170 of FIG. 13. A top view structure of the display panel 10 is shown with the reflective layer 1500 covering at least the sidewall surface, facing the plurality of Micro LEDs 130, of the wall structure 140. Three of the plurality of Micro LEDs 130 are disposed in the pixel area 170, and the light emitting colors of the plurality of Micro LEDs 130 may be red, green, and blue, respectively, to form a pixel unit capable of emitting white light. Exemplarily, in a direction from the plurality of Micro LEDs 130 to the wall structure 140, the width of the plurality of Micro LEDs 130 is F1, the distance between the boundary of the plurality of Micro LEDs 130 and the boundary, close to the plurality of Micro LEDs 130, of the reflective layer 150 is F2, the width of the reflective layer 150 is F3, the width of the wall structure 140 is F4, and 110 μm≤F1≤30 μm, 2 μm≤F2≤5 μm, 2 μm≤F3≤5 μm, 5 μm≤F4≤10 μm.

Since the plurality of Micro LEDs 130 are small in size and the spaces between the adjacent ones of the plurality of Micro LEDs 130 are large, each of the plurality of Micro LEDs 130 is surrounded by a separate wall structures 140, so that optical crosstalk can be effectively prevented, the light utilization rate of the plurality of Micro LEDs 130 can be increased, and the display effect of the display panel 10 can be improved.

Figure 15:
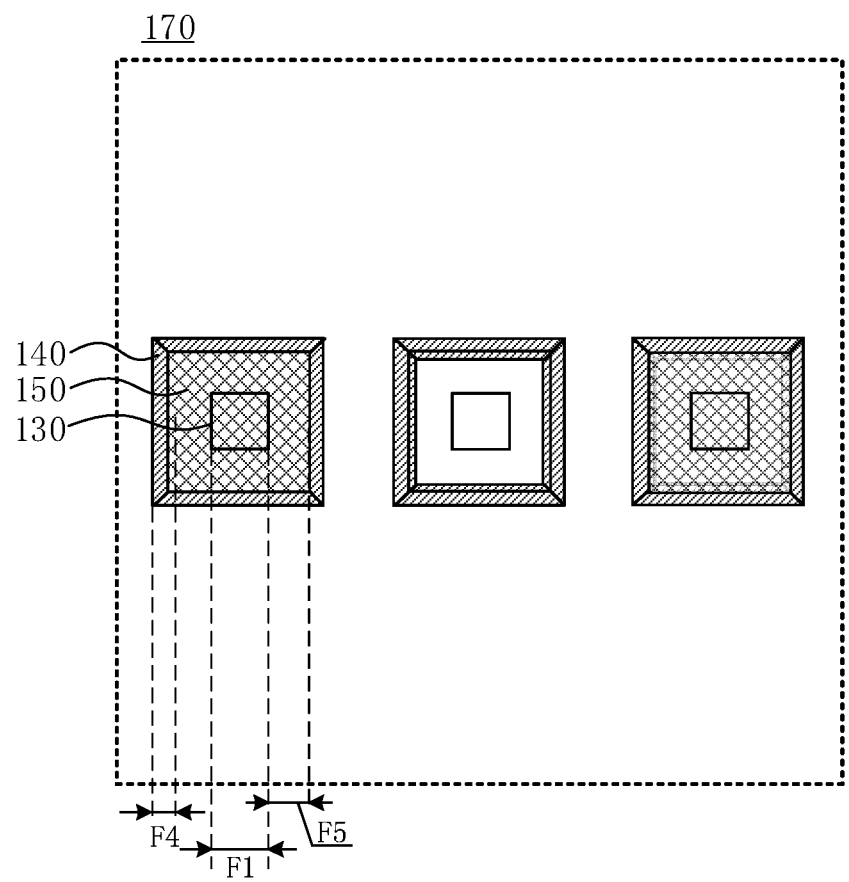
FIG. 15 is another enlarged view of a structure of the pixel area 170 of FIG. 13.

Exemplarily, FIG. 15 is another enlarged view of a structure of the pixel area 170 of FIG. 13. Similarities between FIG. 15 and FIG. 14 are not described here. The difference lies in that, in FIG. 15, the reflective layer 150 covers not only the sidewall surface, facing the plurality of Micro LEDs 130, of the wall structures 140, but also the surface of the first substrate 210 connecting each two adjacent Micro LEDs 130. Exemplarily, in a direction from the plurality of Micro LEDs 130 to the wall structures 140, the width of the plurality of Micro LEDs 130 is F1, the width of the wall structures 140 is F4, and the width of the portion of the reflective layer 150 beyond the plurality of Micro LEDs 130 is F5, where 4 μm≤F5≤10 μm.

With reference to FIGS. 13 to 15, based on the above numerical ranges, with respect to a separate pixel area 170, the reflective layer 150 occupies a proportion of 1%-7% of a unit pixel. On this basis, if the wall structures 140 are made of a light shielding material, both the wall structures 140 and the reflective layers 150 are light-tight areas, and these two types of structures occupy a total proportion of up to 20% of the unit pixel area. With this proportion, it is still ensured that a sufficient light transmitting area is reserved in the second display area 112, so that ambient light can pass through the light transmitting area and be detected by the sensor, thereby ensuring that the sensor can work normally.

It should be noted that FIGS. 14 and 15 merely exemplarily show that the number of Micro LEDs 130 in a single pixel area 170 is 3, the plurality of Micro LEDs 130 are arranged in a row, and the shape of the plurality of Micro LEDs 130 is square, but the display panel 10 provided by embodiments of the present disclosure is not limited thereto. In other embodiments, the number, arrangement, light emitting color, and shape of the plurality of Micro LEDs 130 in the independent pixel area 170 may be configured according to the actual requirement of the display panel 10, which is not limited in embodiments of the present disclosure.

It should also be noted that in the actual process, the reflective layer 150 is usually formed by a wet etching process, so that there is usually a difference of 2 μm-3 μm between the boundary of the reflective layer 150 close to the plurality of Micro LEDs 130 and the boundary of the wall structures 140 close to the plurality of Micro LEDs 130, and the reflective layer 150 is closer to the plurality of Micro LEDs 130, and the structural feature can be understood with reference to FIG. 14.

On the basis of the above-mentioned embodiments, embodiments of the present disclosure further provide a display device. The display device includes any one of the display panels provided in the above-mentioned embodiments. Therefore, the display device also has beneficial effects of the display panel provided in the above-mentioned embodiments; similarities may be understood with reference to the above description and will not be described hereinafter.

Figure 16:
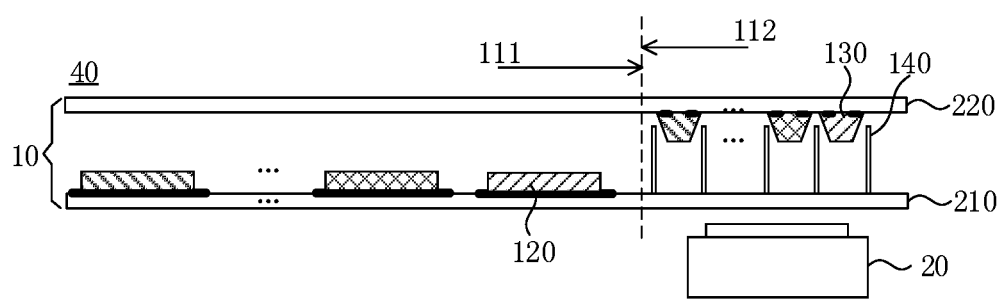
FIG. 16 is a structural diagram of a display device according to embodiments of the present disclosure.

Exemplarily, FIG. 16 is a structural diagram of a display device according to embodiments of the present disclosure. Referring to FIG. 16, the display device 40 includes: a display panel 10, further includes a sensor module 20 disposed in the second display area 112.

The sensor module 20 includes one or more of: a camera module, a photosensitive sensor, and an ultrasonic distance sensor.

Exemplarily, the display device 40 is a mobile phone or a tablet computer. When the sensor module 20 is a camera module, the second display area 112 accommodates a front-facing camera of the mobile phone or the tablet computer correspondingly, the light emitting area is used for display, and the light transmitting area is configured such that light passes through the light transmitting area and travels into the front-facing camera so that the camera can capture an external image. When the sensor is a photosensitive sensor, the photosensitive sensor may be configured to sense external light and adjust the light brightness of the display device, or may be configured to sense whether a fingerprint is present externally so as to perform fingerprint recognition; the photosensitive sensor is configured to also receive external light through the light transmitting area of the second display area 112 and then perform sensing and the light emitting area is configured such that an image is displayed in the light emitting area together with the display area 111.

Exemplarily, the display device 40 may include a mobile phone, a tablet computer and a smart wearable device etc. (such as a smartwatch), and no limitations are made thereto in the embodiments of the present disclosure.

Based on the same disclosure, the embodiment of the present disclosure further provides a method for producing a display panel, or that is to say, the method for producing an display panel can form the display panel provided by the foregoing embodiment, so that the method for manufacturing the display panel also has the beneficial effects of the display panel, and the same parts can be understood by referring to the above explanation of the display panel, and will not be described again hereinafter.

Figure 17:
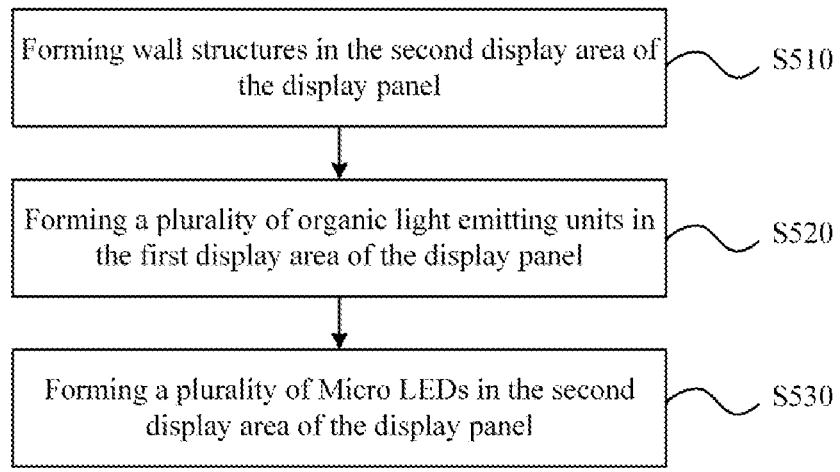
FIG. 17 is a flowchart illustrating a method for manufacturing a display panel according to embodiments of the present disclosure.

Exemplarily, FIG. 17 is a flowchart illustrating a manufacturing method of a display panel according to an embodiment of the present disclosure. Referring to FIG. 17, the manufacturing method of the display panel includes the steps described below.

In S510, wall structures are formed in the second display area of the display panel.

The wall structures are used for weakening or blocking optical crosstalk of the plurality of Micro LEDs to the peripheral display units.

Exemplarily, referring to any one of FIGS. 2 to 13, the second display area 112 is multiplexed as the sensor reserved area 112, the second display area 112 includes a light emitting area and a light transmitting area, and the wall structures 140 are formed in gaps between adjacent ones of the plurality of Micro LEDs and gaps between the plurality of Micro LEDs and the plurality of organic light emitting units.

Exemplarily, the wall structures may be formed in the same process step as at least one film in the display panel.

In S520, a plurality of organic light emitting units are formed in the first display area of the display panel.

Exemplarily, referring to any one of FIGS. 4 to 12, each organic light emitting unit 120 may include a first electrode and a second electrode disposed opposite to each other, and a light emitting layer formed between the first electrode and the second electrode. It should be noted that the manner in which the plurality of organic light emitting units are formed may be any manner knowable to those skilled in the art, and will not be described and limited in embodiments of the present disclosure.

In S530, a plurality of Micro LEDs are formed in the second display area of the display panel.

The step includes forming a plurality of single-grain finished Micro LEDs by a Micro LED manufacturing process, and then each light emitting area is securely and electrically connected to the plurality of Micro LEDs, that is, the light emitting area is formed by the plurality of Micro LEDs.

Exemplarily, the Micro LED manufacturing process may be any process knowable to those skilled in the art, and the Micro LED manufacturing process will not be described in detail and limited in embodiments of the present disclosure.

In the display panel provided by embodiments of the present disclosure, wall structures are configured in gaps between the plurality of Micro LEDs and the plurality of organic light emitting units and gaps between adjacent Micro LEDs of the plurality of Micro LEDs. With this arrangement, the wall structures are used to block the transmission of Micro LED's lateral light to the peripheral display units. In this way, the optical crosstalk of the lateral light of the plurality of Micro LEDs to the peripheral display units is weakened, and the display effect of the display panel is improved.

It should be noted that FIG. 17 merely exemplarily shows that S510, S520, and S530 are performed sequentially, and does not constitute a limitation on the method for manufacturing the display panel provided by embodiments of the present disclosure. In other implementations, S520 may be performed before S510 or S530 may be performed in parallel with S510 and S520 according to the actual requirement of the display panel, which is not limited in embodiments of the present disclosure.

Figure 18:
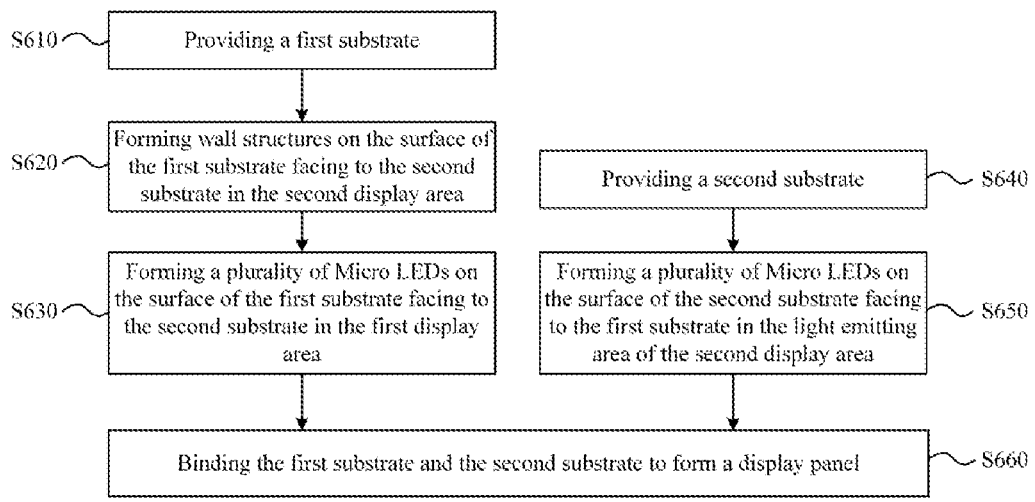
FIG. 18 is a flowchart illustrating another method for manufacturing a display panel according to embodiments of the present disclosure.

Optionally, FIG. 18 is a flowchart illustrating another method for manufacturing a display panel according to embodiments of the present disclosure. Referring to FIG. 18, the method for manufacturing the display panel may further includes the steps described below.

In S610, a first substrate is provided. The first substrate includes a first display area and a second display area. The first display area is an organic-light-emitting-unit display area, and the second display area is reserved as a Micro LED display area. In S620, wall structures are formed on the surface of the first substrate facing to the second substrate in the second display area.

It should be noted that, in the actual process, no second substrate is provided for reference, and this step may include forming, in the first display area, wall structures on one side of the first substrate.

In S620, a plurality of organic light-emitting units are formed on the surface, facing the second substrate, of the first substrate in the first display area. Similarly to S620, the step may include forming, in the second display area, a plurality of organic light emitting units on one side of the first substrate where the plurality of organic light emitting units are formed.

In S40, a second substrate is provided.

The second substrate includes a first display area and a second display area. The first display area is an organic-light-emitting-unit display area, and the second display area is reserved as a Micro LED display area.

In S650, a plurality of Micro LEDs are formed on the surface, facing the first substrate, of the second substrate in the light emitting area of the second display area.

It should be noted that, in the actual process, no second substrate is provided for reference, and the step may include forming, in the second display area, a plurality of Micro LEDs on one side of the second substrate.

Thereafter, S660 is further included.

In S660, the first substrate and the second substrate are bonded to form a display panel.

One side, where each of the plurality of organic light emitting units and the wall structures are formed, of the first substrate faces the second substrate. One side, where the plurality of Micro LEDs are formed, of the second substrate faces the first substrate. After the bonding, the wall structures are also configured in gaps between the plurality of organic light-emitting units and the plurality of Micro LEDs. In this way, the wall structures can weaken or avoid the optical crosstalk, and thereby improve the display effect of the display panel.

It should be noted that in the method for manufacturing the display panel shown in FIG. 18, the plurality of organic light emitting units and the plurality of Micro LEDs are formed on different substrates. Therefore, in the manufacturing process, the plurality of organic light emitting units and the plurality of Micro LEDs may be formed separately. Exemplarily, S610, S620 and S630 may be performed sequentially, and S640 and S650 may be performed sequentially, but the timing sequence of S640 and S650 in S610, S620 and S630 is not limited, and the display panel may be formed by the first substrate and the second substrate that are bonded after the two sub-processes are completed.

Figure 19:
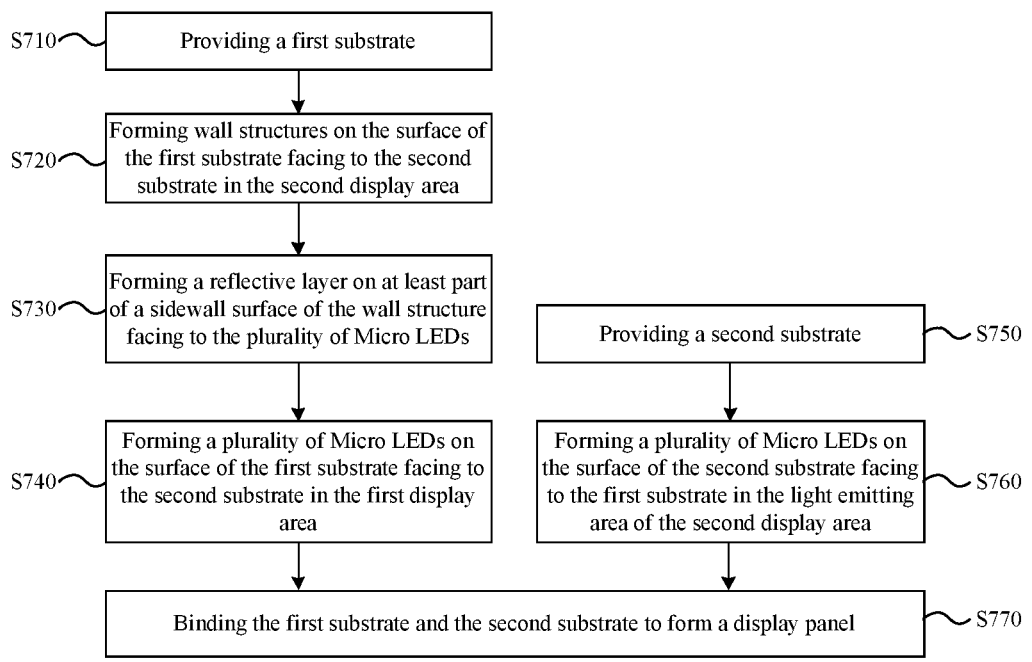
FIG. 19 is a flowchart illustrating another method for manufacturing a display panel according to embodiments of the present disclosure.

Optionally, FIG. 19 is a flowchart illustrating another method for manufacturing a display panel according to embodiments of the present disclosure. Referring to FIG. 19, the method for manufacturing the display panel may further include the steps described below.

In S710, a first substrate is provided.

In S720, wall structures are formed on the surface of the first substrate facing to the second substrate in the second display area.

Optionally, this step may further include sequentially forming a buffer layer, a gate insulation layer, an interlayer dielectric layer, an intermediate insulation layer, a passivation layer, a planarization layer, and a pixel defining layer on one side surface, facing the second substrate, of the first substrate.

Optionally, the wall structures may be formed in the same process step as the planarization layer and/or the pixel defining layer.

Optionally, before this step, the method may further include forming at least a portion of the film before the forming of the wall structures in the step of patterning the second display area to form via hole structures for placing the wall structures. The depth of the via hole structure is less than or equal to the total thickness of the buffer layer, the gate insulation layer, the interlayer dielectric layer, the intermediate insulation layer and the passivation layer.

The step may include forming wall structures in the via hole structures.

It should be noted that the via hole structure may be formed after the buffer layer, the gate insulation layer, the interlayer dielectric layer, the intermediate insulation layer, and the passivation layer are formed, or may be formed during the patterning process of each film, which is not limited in embodiments of the present disclosure.

In S730, a reflective layer is formed on at least part of a sidewall surface of the wall structure facing to the plurality of Micro LEDs.

The reflective layer helps improve the light utilization ratio of the plurality of Micro LEDs.

Optionally, the reflective layer and the metal electrode layer in the organic light emitting unit are formed in the same process step. Thus, it is feasible not to increase process steps, new materials and the films of the display panel.

In S740, a plurality of organic light emitting units are formed on the surface, facing the second substrate, of the first substrate in the first display area facing to the second substrate.

It should be noted that S730 may be a sub-step of S740.

In S750, a second substrate is provided.

In S760, a plurality of Micro LEDs are formed on the surface, facing the first substrate, of the second substrate in the light emitting area of the second display area.

In S770, the first substrate and the second substrate are bonded to form a display panel.

It should be noted that FIGS. 17 to 19 merely exemplarily show that the plurality of organic light emitting units are formed before the plurality of Micro LEDs are formed. In other implementations, the plurality of Micro LEDs may be formed before the plurality of organic light emitting units are formed or the plurality of organic light emitting units and the plurality of Micro LEDs may be performed synchronously, which is not limited in embodiments of the present disclosure.

It should also be noted that FIG. 18 merely exemplarily shows that when the the planarization layer and/or the pixel defining layer are multiplexed as wall structures, the wall structures are formed prior to the plurality of organic light emitting units. FIG. 19 merely exemplarily shows that when a metal electrode layer in the plurality of organic light emitting units is multiplexed as the reflective layer, the reflective layer is formed prior to the plurality of organic light emitting units. However, the method for manufacturing the display panel provided by embodiments of the present disclosure is not limited to the methods shown in FIGS. 18 and 19. In other implementations, the wall structures and/or the reflective layer may be disposed according to actual requirements of the display panel and the manufacturing method thereof, and the forming timing may be configured according to the actual requirements, which is not limited in embodiments of the present disclosure.

It should also be noted that FIGS. 18 and 19 merely exemplarily show that the plurality of organic light emitting units and the wall structures are formed on the first substrate and the plurality of Micro LEDs are formed on the second substrate. In other implementations, the plurality of organic light emitting units, the wall structures and the plurality of Micro LEDs are formed on the first substrate or the second substrate, and may be disposed according to actual requirements of the display panel and the manufacturing method thereof, which will not be described and limited by embodiments of the present disclosure.

Embodiments of the present disclosure provide a display panel. The display panel is provided with wall structures configured in gaps between the plurality of Micro LEDs and the plurality of organic light emitting units and gaps between adjacent ones of the plurality of Micro LEDs. Therefore, the wall structures are used to block the transmission of Micro LED's lateral light to the peripheral display units. Then the optical crosstalk of the lateral light of the plurality of Micro LEDs to the peripheral display units is weakened, and the display effect of the display panel is improved. Moreover, the formation of the reflective layer helps improve the light utilization ratio of the plurality of Micro LEDs.

It is to be noted that the above are merely preferred embodiments of the present disclosure and the technical principles used therein. It can be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
    a display area comprising a first display area and a second display area, wherein the second display area is multiplexed as a sensor reserved area, and the second display area comprises a light transmitting area and a light emitting area;
    wherein the first display area is provided with a plurality of organic light emitting units, the light emitting area of the second display area is provided with a plurality of Micro Light Emitting Diodes (Micro LEDs), and the second display area is further provided with wall structures disposed in gaps between the plurality of Micro LEDs and the plurality of organic light emitting units and gaps between adjacent Micro LEDs of the plurality of Micro LEDs;
    wherein the display panel comprises a first substrate and a second substrate disposed opposite to each other;
    wherein in the first display area, the plurality of organic light emitting units are disposed on a surface of the first substrate facing to the second substrate; in the light emitting area of the second display area, the plurality of Micro LEDs are disposed on a surface of the second substrate facing to the first substrate; and
    wherein in the second display area, the wall structures are disposed on the surface of the first substrate facing to the second substrate.

2. The display panel of claim 1, wherein a distance from one side surface of the wall structures facing away from the first substrate to the first substrate is greater than or equal to a distance from one side surface of a light emitting layer of the plurality of Micro LEDs facing away from the first substrate to the first substrate.

3. The display panel of claim 2, wherein the reflective layer and a metal electrode layer in the plurality of organic. light emitting units are formed by using a same material in a same process step.

4. The display panel of claim 1, wherein for each of the plurality of Micro LEDs, vertical projections of the wall structures on the first substrate are disposed to surround a vertical projection of each of the plurality of Micro LEDs on the first substrate.

5. The display panel of claim 1, further comprising a reflective layer, wherein at least a sidewall surface of the wall structures facing to the plurality of Micro LEDs is covered by the reflective layer.

6. The display panel of claim 5, wherein an angle between the reflective layer covering the sidewall surface of the wall structures and the first substrate is A, wherein $30°≤A≤70°$.

7. The display panel of claim 5, wherein an angle between the reflective layer covering the sidewall surface of the wall structures and the first substrate is A, wherein $45°≤A≤65°$.

8. The display panel of claim 5, wherein the reflective layer is further disposed on a surface of the first substrate two adjacent Micro LEDs of the plurality of Micro LEDs.

9. The display panel of claim 5, when a side of the reflective layer facing to the first substrate is defined as a bottom of the reflective layer and a side the reflective layer facing away from the first substrate is defined as a top reflective layer, the reflective layer has an opening when extending from the base to the top.

10. The display panel of claim 1, wherein the first display area is further provided with a pixel driving circuit, a planarization layer and a pixel defining layer sequentially stacked on the surface of the first substrate facing to the second substrate;
    wherein the pixel defining layer comprises a plurality of pixel openings, and each of the plurality of organic light emitting units is disposed in one of the plurality of pixel openings; and
    the wall structures and the planarization layer and/or the pixel defining layer are formed by using a same material in a same process step.

11. The display panel of claim 10, wherein each of the wall structures comprises a first sub-wall layer and a second sub-wall layer stacked on one side of the first substrate facing to the second substrate, wherein the first sub-wall layer and the planarization layer are disposed in a same layer, and the second sub-wail layer and the pixel defining layer are disposed in a same layer.

12. The display panel of claim 10, wherein a light absorption coefficient of a material of the pixel defining layer is B, and $B≥80\%$.

13. The display panel of claim 10, wherein in the first display area, the driving circuit comprises a buffer layer, a gate insulation layer, an interlayer dielectric layer, a intermediate insulation layer and a passivation layer stacked on the surface of the first substrate facing to the second substrate;
    wherein the buffer layer, the gate insulation layer, the interlayer dielectric layer, the intermediate insulation layer and the passivation layer extend to the second display area continuously;
    wherein a via hole structure is configured in the second display area; a depth of the via hole structure is less than or equal to the total thickness of the buffer layer, the gate insulation layer, the interlayer dielectric layer, the intermediate insulation layer and the passivation layer; and the wall structures are disposed in the via hole structure.

14. The display panel of claim 1, wherein display panel further includes a pixel driving circuit, a planarization layer and a pixel defining layer sequentially stacked on the surface of the first substrate facing to the second substrate;

wherein the pixel defining layer includes a plurality of pixel openings, and each of the plurality of organic light emitting units is disposed in one of the pixel openings, and the pixel defining layer is made of a black material.

15. A display device, comprising the display panel of claim 1.

16. A display panel, comprising:

a display area comprising a first display area. and a second display area, wherein the second display area is multiplexed as a sensor reserved area, and the second display area comprises a light transmitting area and a light emitting area;

wherein the first display area is provided with a plurality of organic light emitting units, the light emitting area of the second display area is provided with a plurality of Micro Light Emitting Diodes (Micro LEDs), and the second display area is further provided with wall structures disposed in gaps between the plurality of Micro LEDs and the plurality of organic light emitting units and gaps between adjacent Micro LEDs of the plurality of Micro LEDs;

wherein the display panel comprises a first substrate and a second substrate disposed opposite to each other; and wherein in the first display area, the plurality of organic light emitting units are disposed on a surface of the first substrate facing to the second substrate; in the light emitting area of the second display area, the plurality of Micro LEDs are disposed on a surface of the first substrate facing to the second substrate.

* * * * *